United States Patent
Han et al.

(10) Patent No.: US 7,462,893 B2
(45) Date of Patent: Dec. 9, 2008

(54) METHOD OF FABRICATING GAN

(75) Inventors: Jai-yong Han, Suwon-si (KR);
Jun-sung Choi, Suwon-si (KR); In-jae Song, Yongin-si (KR)

(73) Assignee: Samsung Corning Co., Ltd., Suwon-si (KR)

( * ) Notice: Subject to any disclaimer, the term of this patent is extended or adjusted under 35 U.S.C. 154(b) by 51 days.

(21) Appl. No.: 11/545,520

(22) Filed: Oct. 11, 2006

(65) Prior Publication Data

US 2007/0092980 A1 Apr. 26, 2007

(30) Foreign Application Priority Data

Oct. 25, 2005 (KR) .................. 10-2005-0100896

(51) Int. Cl.
*H01L 31/071* (2006.01)
*H01L 31/109* (2006.01)
*H01L 31/0328* (2006.01)
*H01L 31/0336* (2006.01)

(52) U.S. Cl. .............. 257/200; 257/201; 257/E21.108; 257/E21.097; 257/E21.117; 257/E21.121; 257/E21.215; 257/E21.218

(58) Field of Classification Search .............. 257/200, 257/201, 75, 76, 77, 78, 744, 745, 742
See application file for complete search history.

(56) References Cited

U.S. PATENT DOCUMENTS 6,579,359 B1 *  6/2003  Mynbaeva et al. ............. 117/94
7,118,034 B2 * 10/2006  Baldassari et al. .......... 235/383
2002/0197825 A1 * 12/2002  Usui et al. .................. 438/459
2005/0042743 A1 *  2/2005  Kawai et al. ............. 435/287.2
2007/0082465 A1 *  4/2007  Song et al. ................. 438/478
2007/0141813 A1 *  6/2007  Song .......................... 438/483

OTHER PUBLICATIONS

Mynbarva et al., "Strain Relaxation in GaN layers grown on porous GaN sublayers." *MRS Internet Journal Nitride Semiconductor Research*, Res. 4, 14, 1999., pp. 1-5.
Li et al., "In-plane bandgap control in porous GaN through electroless wet chemical etching." *Applied Physics Letters*. vol. 80, No. 6, Feb. 11, 2002, pp. 980-982.
Oshima et al., "Fabrication of Freestanding GaN Wafers by Hydride Vapor-Phase Epitaxy with Void-Assisted Seperation." *Phys. Stat. Sol.* (a) 194 No. 2, 2002, pp. 554-558.

(Continued)

*Primary Examiner*—David Nhu
(74) *Attorney, Agent, or Firm*—Stein, McEwen & Bui, LLP

(57) ABSTRACT

A method of fabricating a thick gallium nitride (GaN) layer includes forming a porous GaN layer having a thickness of 10-1000 nm by etching a GaN substrate in a reaction chamber in an HCl and $NH_3$ gas atmosphere and forming an in-situ GaN growth layer in the reaction chamber. The method of forming the porous GaN layer and the thick GaN layer in-situ proceeds in a single chamber. The method is very simplified compared to the prior art. In this way, the entire process is performed in one chamber, and in particular, GaN etching and growth are performed using an HVPE process gas such that costs are greatly reduced.

15 Claims, 5 Drawing Sheets

OTHER PUBLICATIONS

Oshima et al., "Preparation of Freestanding GaN Wafers by Hydride Vapor Phase Epitaxy with Void-Assisted Separation." *Applied Physics Letters*. vol. 42, No. 1A/B, 2003, pp. L1-L3.

U.S. Appl. No. 11/545,518, filed Oct. 11, 2006, In-Jae et al.
U.S. Appl. No. 11/598,568, filed Nov. 14, 2006, In-Jae Song.

* cited by examiner

METHOD OF FABRICATING GAN

CROSS-REFERENCE TO RELATED APPLICATIONS

This application claims the benefit of Korean Patent Application No. 2005-100896, filed on Oct. 25, 2005, in the Korean Intellectual Property Office, the disclosure of which is incorporated herein in its entirety by reference.

BACKGROUND OF THE INVENTION

1. Field of the Invention

Aspects of the present invention relates to a method of fabricating GaN, and more particularly, to a method of forming porous GaN and a method of fabricating thick GaN using the same.

2. Description of the Related Art

A variety of methods of fabricating GaN for use as substrates for blue or UV-based light emitting devices have been proposed. In most conventional methods of fabricating GaN, porous GaN is formed on a substrate, such as an SiC substrate or a sapphire substrate. Then, thick GaN is grown on the porous GaN.

Mynbaeva et al. suggest a method of growing GaN on an SiC substrate. The method uses a HF solution under ultraviolet light excitation to form porous GaN. This method requires a separate wet etching process in addition to a film formation process, thus necessitating an additional cleaning process (Strain relaxation in GaN Layers grown on porous GaN sublayers (MRS Internet J. Nitride Semicond. Res. 4, 14(1999)))

Xiuling Li et al. suggest a method of forming porous GaN using metal-assisted electroless wet etching using a metal such as Pt, etc. This method also requires additional processes of forming a metallic layer and etching. Thus, the processes are complicated. (In-plane bandgap control in porous GaN through electroless wet chemical etching (Volume 80, Number 6, 11 Feb. 2002, Applied Physics Letters))

Yuichi Oshima et al. suggest a method of porous GaN using an ex-situ process using metal such as Ti, etc. This method also involves complicated and expensive processes. (Preparation of Freestanding GaN Wafers by Hydride Vapor Phase Epitaxy with Void-Assisted Separation(Jpn. J. Appl. Phys. Vol. 42 (2003) pp. L1-L3 Part 2, No. 1A/B, 15 Jan. 2003))

SUMMARY OF THE INVENTION

Aspects of the present invention provide a method of forming porous GaN using an in-situ process.

Aspects of the present invention also provide a method of forming a GaN layer using an in-situ process.

According to an aspect of the present invention, there is provided a method of forming a porous GaN layer having a thickness of 10-1000 nm comprising etching a GaN substrate in a reaction chamber in an HCl and $NH_3$ gas atmosphere.

According to another aspect of the present invention, there is provided a method of fabricating GaN, the method including: forming a porous GaN layer having a thickness of 10-1000 nm by etching a GaN substrate in a reaction chamber in an HCl and $NH_3$ gas atmosphere; and forming a GaN growth layer on the porous GaN layer to a predetermined thickness by supplying a GaN source to the reaction chamber.

Additional aspects and/or advantages of the invention will be set forth in part in the description which follows and, in part, will be obvious from the description, or may be learned by practice of the invention.

BRIEF DESCRIPTION OF THE DRAWINGS

The patent or application file contains at least one drawing executed in color. Copies of this patent or patent application publication with color drawing(s) will be provided by the U.S. Patent and Trademark Office upon request and payment of the necessary fee. These and/or other aspects and advantages of the invention will become more apparent and more readily appreciated from the following description of the embodiments, taken in conjunction with the accompanying drawings of which.

DETAILED DESCRIPTION OF THE EMBODIMENTS

Figure 1A:
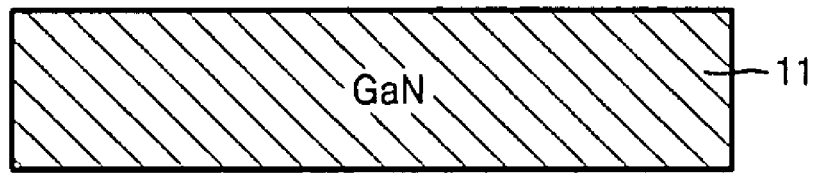
FIGS. 1A through 1D illustrate a method of fabricating GaN according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

A method of fabricating GaN according to aspects of the present invention is an in-situ process in which a plurality of processes are performed in a single chamber.

Aspects of the present invention will now be described more fully with reference to the accompanying drawings, in which exemplary embodiments of the invention are shown.

Referring to FIG. 1A, a freestanding GaN substrate 11 is prepared.

Figure 1B:
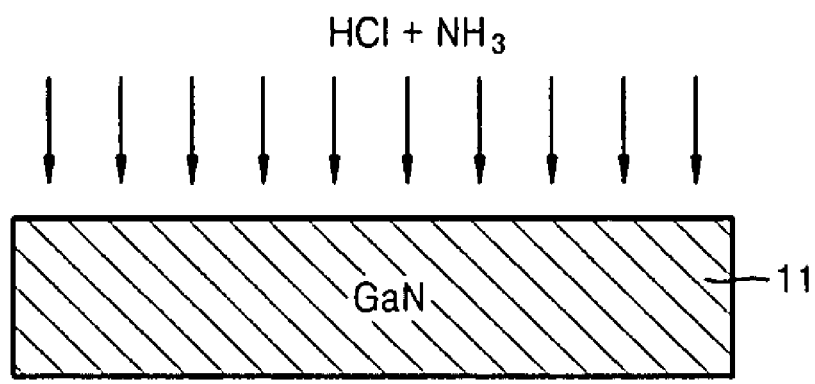
Figure 1C:
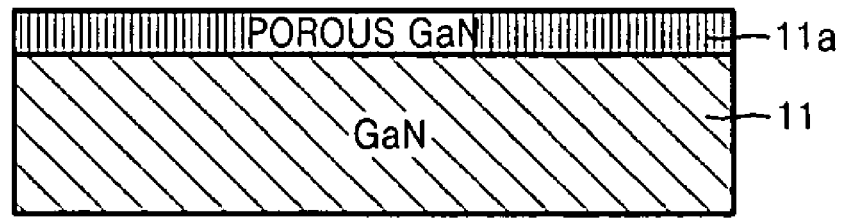

Referring to FIG. 1B, the substrate 11 is mounted in a reaction chamber and then an HCl gas and an $NH_3$ gas are injected into the reaction chamber so that the surface of the substrate 11 is etched. According to this etching, a porous GaN layer 11a is formed on the surface of the substrate 11, as illustrated in FIG. 1C.

Figure 1D:
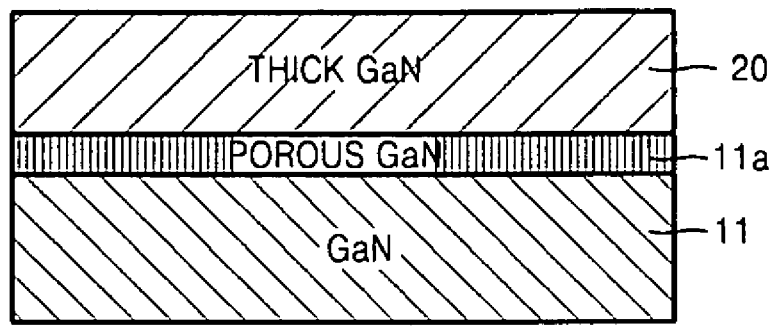

Referring to FIG. 1D, a source for GaN crystal growth is supplied to the reaction chamber and a thick GaN growth layer 20 is formed on the porous GaN layer 11a using a well-known method.

FIGS. 2A through 2D relate to a process in which a GaN substrate layer is formed on a sapphire substrate as a starting substrate, unlike the above-described embodiment in which a freestanding GaN substrate is used as the starting substrate.

Figure 2A:
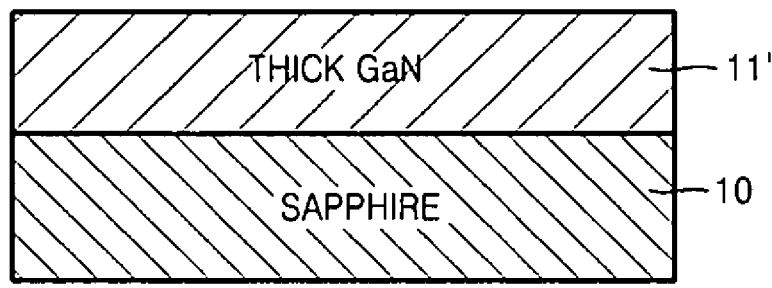
FIGS. 2A through 2D illustrate a method of fabricating GaN according to another embodiment of the present invention.

Referring to FIG. 2A, a sapphire substrate 10 is mounted in a reaction chamber and then, a GaN substrate layer 11' is grown on the sapphire substrate 10 by supplying a predetermined amount of GaCl gas and a predetermined amount of $NH_3$ gas together with an $N_2$ buffer gas.

Figure 2B:
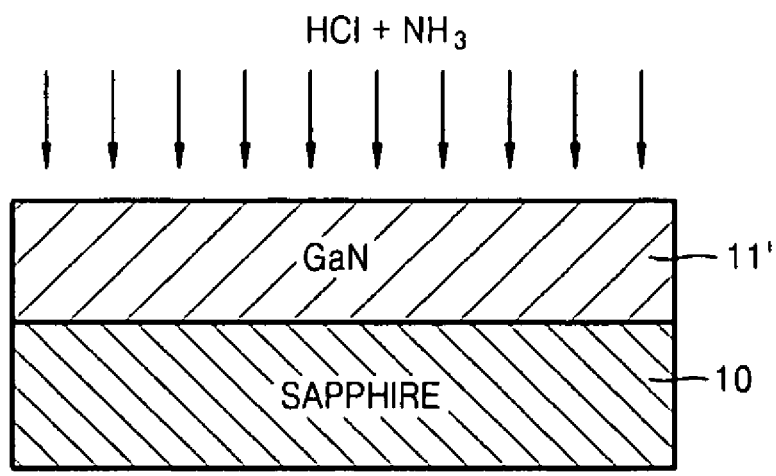
Figure 2C:
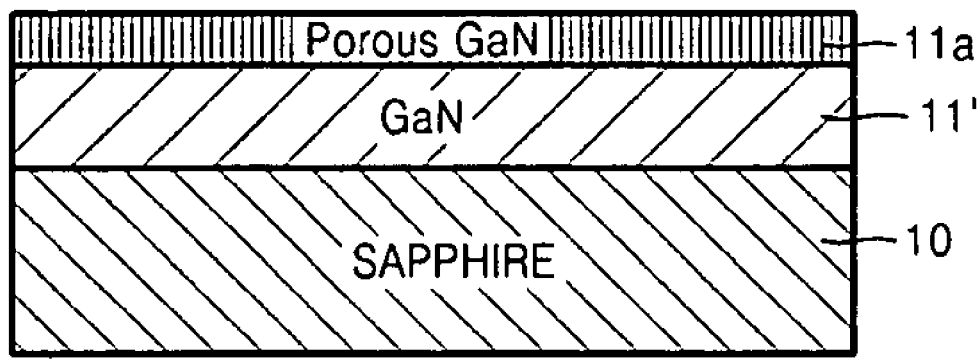

Referring to FIG. 2B, subsequent to the growth of the GaN substrate layer 11', HCl gas and $NH_3$ gas are supplied to the same chamber so that the surface of the GaN substrate layer 11' is etched. This etching enables a porous GaN layer 11a having a thickness of 10-1000 nm to be formed on the surface of the GaN substrate layer and the sapphire substrate 10, as illustrated in FIG. 2C.

Figure 2D:
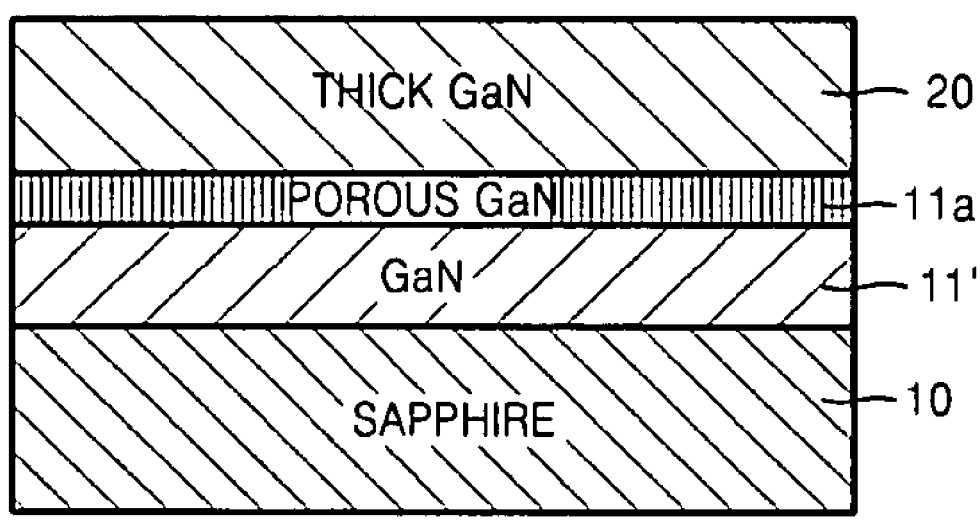

Referring to FIG. 2D, a source for GaN crystal growth is supplied into the reaction chamber so that a thick GaN growth layer 20 can be formed on the porous GaN layer 11a.

As described in the two embodiments illustrated in FIGS. 1A through 1D and FIGS. 2A through 2D, a GaN layer on which a substrate for forming a porous GaN layer is formed on a crystalline substrate, such as a freestanding GaN or sapphire substrate, is used in the method according to aspects of the present invention.

The apparatus used in the above process is a hydride vapor phase epitaxy (HVPE) system. The growth of GaN layers and the formation of porous GaN may be performed without interruption in the facility. Conditions for forming porous GaN will now be described.

Figure 3:
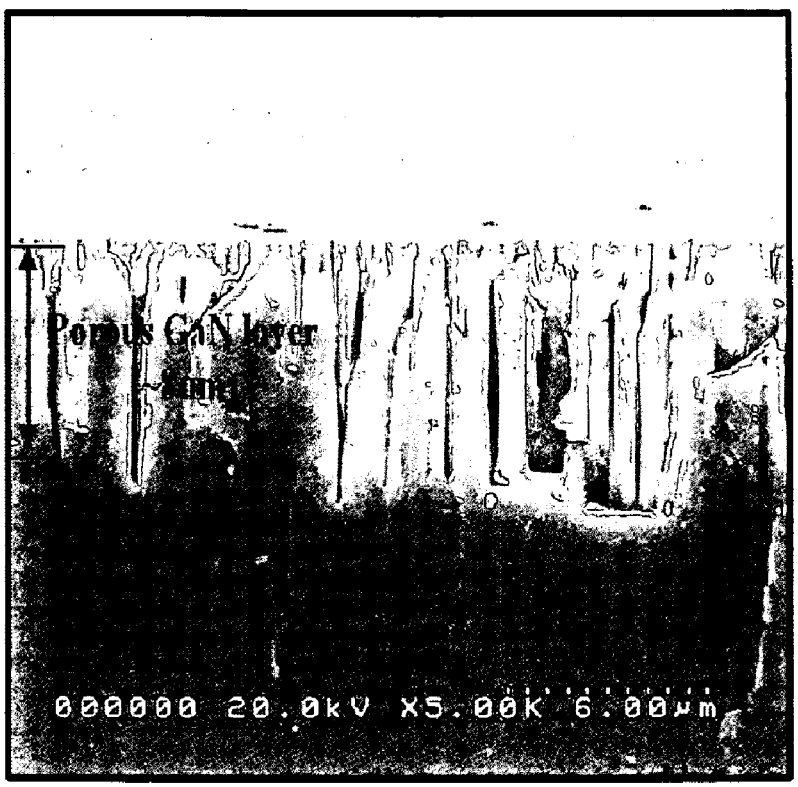
FIG. 3 shows a scanning electron microscope (SEM) image of porous GaN fabricated according to the method of FIGS. 1A through 1D.

A vertical HVPE system is used in GaN etching and GaN growth. After the substrate 10 or 11 is mounted in the reaction chamber, the temperature thereof is raised to 1000° C. or more, for example, to 1065° C., and then the gases needed in etching are provided to the reaction chamber together with an $N_2$ buffer gas for several minutes. In particular, HCl gas and $NH_3$ gas supplied at the rate of 100 sccm of HCl, 1000 sccm of $NH_3$, and 8000 sccm of $N_2$ at atmospheric pressure. When these gases are supplied, decomposition of GaN into Ga takes place on the surface of the GaN substrate or the GaN substrate layer and a GaCl gas and an $H_2$ gas are generated and discharged so that a void having a predetermined depth is formed in the surface of the GaN of the GaN substrate or GaN substrate layer. FIG. 3 represents a scanning electron microscope (SEM) image of porous GaN obtained using the etching conditions described herein. As illustrated in FIG. 3, porous GaN was formed in a GaN surface to a thickness of about 8 microns.

Subsequent to formation of the porous GaN, a GaCl gas and an $NH_3$ gas are supplied to the reaction chamber so that a thick GaN layer is grown on the porous GaN layer.

Figure 4A:
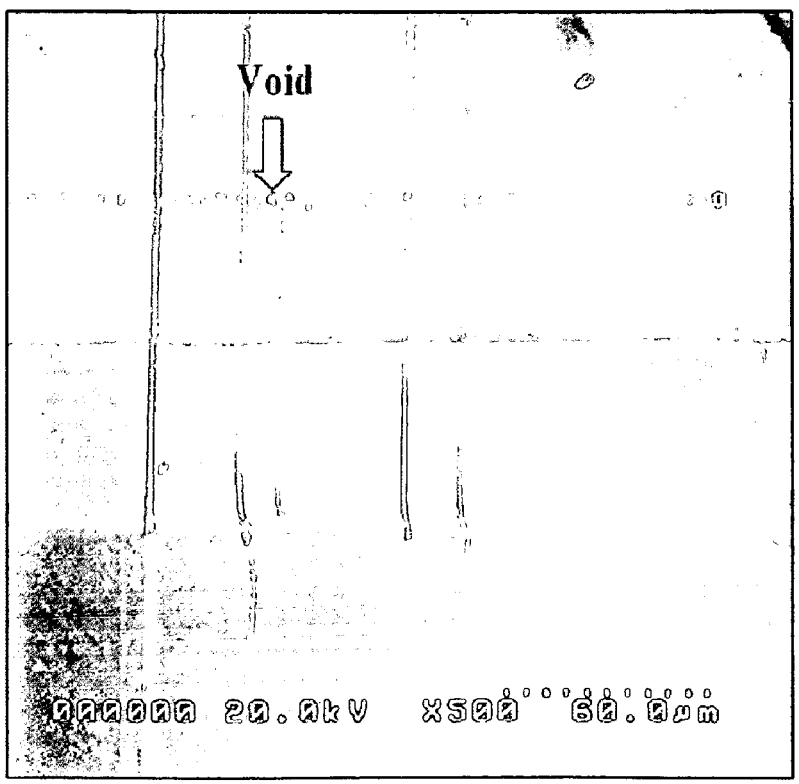
FIG. 4A shows an SEM image of a porous GaN/thick GaN layer fabricated according to the method of FIGS. 1A through 1D.
Figure 4B:
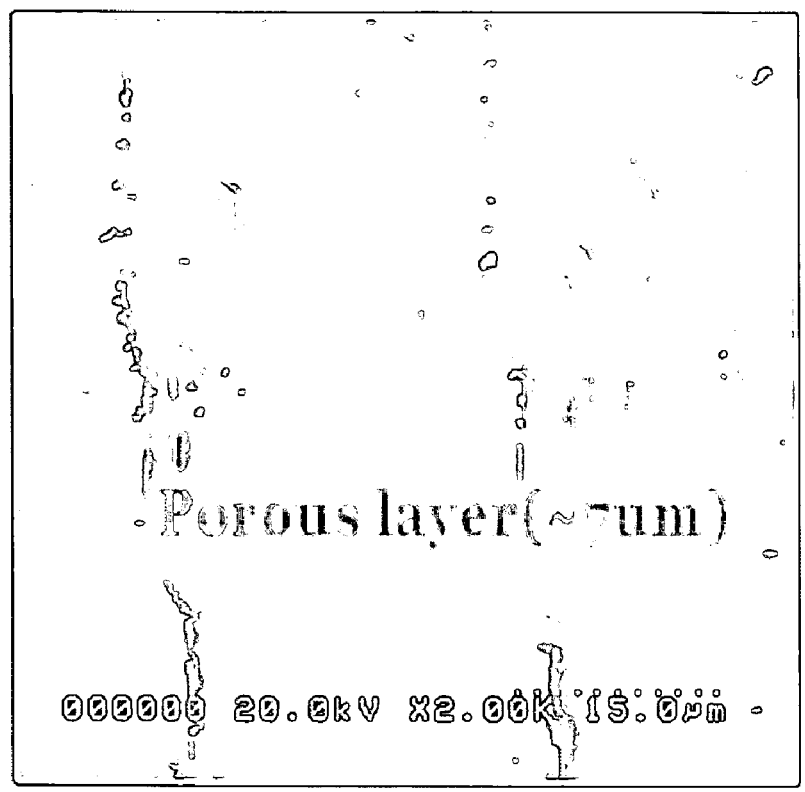
FIG. 4B shows a partially enlarged SEM image of the porous GaN layer illustrated in FIG. 4A.
Figure 4C:
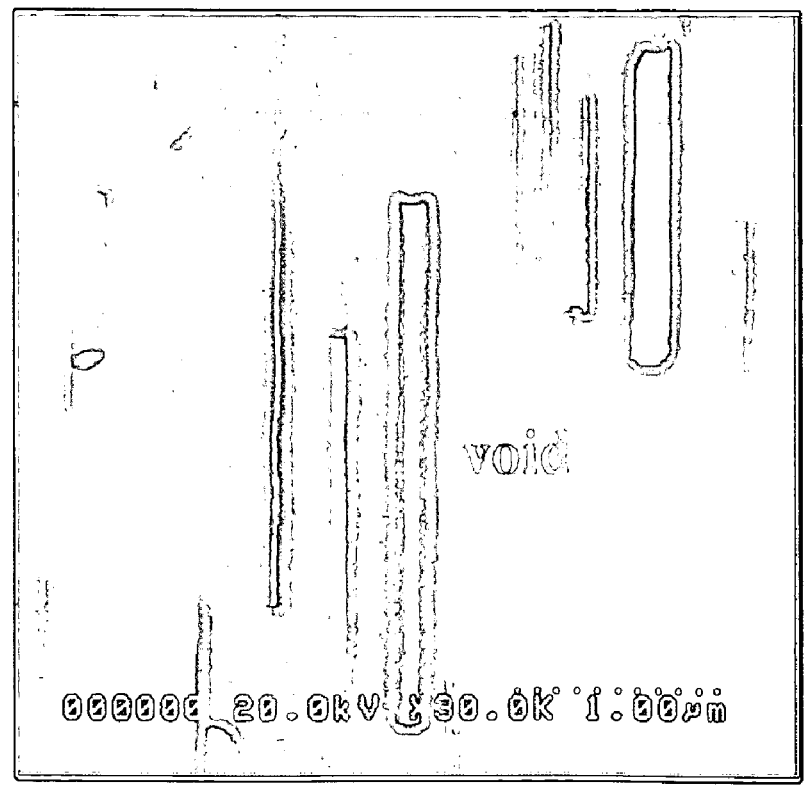
FIG. 4C shows an enlarged SEM image of a dotted-line rectangular edge illustrated in FIG. 4B.

FIG. 4A represents an SEM image of a sample in which a thick GaN layer was grown on a porous GaN layer. In FIG. 4A, the arrow points to the porous GaN layer. FIG. 4B represents a partially enlarged SEM image of a porous GaN layer of the sample illustrated in FIG. 4A. A bright band in the middle of FIG. 4B indicates a porous GaN layer, and the porous GaN layer has a thickness of about 7 microns. FIG. 4C represents a more enlarged view of the porous GaN layer, showing a void formed in the porous GaN layer.

The porous GaN layer having a thickness of 10-1000 nm releases strain when a GaN growth layer is grown on the porous GaN layer. If the porous GaN layer is not within this size range, the GaN porous layer may be unstable and degradation of the crystallinity or cracks in the GaN growth layer may occur.

According to aspects of the present invention described above, a process of forming a porous GaN layer and a thick GaN layer in-situ proceeds in a single chamber. The method according to aspects of the present invention is very simplified compared to the prior art. The entire process is performed in one chamber, and in particular, GaN etching and GaN growth proceed using HVPE process gases such that costs are greatly reduced.

Aspects of the present invention can be applied to the manufacture of a large-scale GaN freestanding substrates, and in particular, GaN substrates having a thickness of several microns can be fabricated in an economical manner.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of forming a porous gallium nitride (GaN) layer having a thickness of 10-1000 nm comprising:
    etching a GaN substrate in a reaction chamber in an HCl and $NH_3$ gas atmosphere.

2. The method of claim 1, wherein the GaN substrate is a freestanding GaN substrate.

3. The method of claim 1, wherein the GaN substrate is a GaN substrate layer formed by growing GaN on a sapphire substrate in the reaction chamber before the forming of the porous GaN layer.

4. The method of claim 1, wherein the etching of the GaN substrate is carried out at a temperature greater than 1000° C.

5. The method of claim 1, wherein the etching of the GaN substrate is performed using a hydride vapor phase epitaxy (HVPE) system.

6. The method of claim 1, wherein the etching of the GaN substrate is carried out by providing HCl at a rate of 100 sccm and $NH_3$ at a rate of 1000 sccm at atmospheric pressure in a buffer gas of $N_2$ supplied at a rate of 8000 sccm.

7. The method of claim 4, wherein the etching of the GaN substrate is carried out by providing HCl at a rate of 100 sccm and $NH_3$ at a rate of 1000 sccm at atmospheric pressure in a buffer gas of $N_2$ supplied at a rate of 8000 sccm.

8. A method of fabricating gallium nitride (GaN) comprising:
    forming a porous GaN layer having a thickness of 10-1000 nm by etching a GaN substrate in a reaction chamber in an HCl and $NH_3$ gas atmosphere; and
    forming the GaN growth layer directly on the porous GaN layer to a predetermined thickness by supplying a GaN source to the reaction chamber.

9. The method of claim 8, wherein the GaN substrate is a freestanding GaN substrate.

10. The method of claim 8, wherein the GaN substrate is a GaN substrate layer formed by growing GaN on a sapphire substrate in the reaction chamber before the forming of the porous GaN layer.

11. The method of claim 8, wherein the etching of the GaN substrate is carried out at a temperature greater than 1000° C.

12. The method of claim 8, wherein the etching of the GaN substrate is performed using a hydride vapor phase epitaxy (HVPE) system.

13. The method of claim 8, wherein the etching of the GaN substrate is carried out by providing HCl at a rate of 100 sccm and $NH_3$ at a rate of 1000 sccm at atmospheric pressure in a buffer gas of $N_2$ supplied at a rate of 8000 sccm.

14. The method of claim 11, wherein the etching of the GaN substrate is carried out by providing HCl at a rate of 100 sccm and $NH_3$ at a rate of 1000 sccm at atmospheric pressure in a buffer gas of $N_2$ supplied at a rate of 8000 sccm.

15. The method of claim 8, wherein the forming of the porous GaN layer and the forming the GaN growth layer take place in situ in a single chamber.

* * * * *

UNITED STATES PATENT AND TRADEMARK OFFICE
CERTIFICATE OF CORRECTION

| | | |
|---|---|---|
| PATENT NO. | : 7,462,893 B2 | Page 1 of 1 |
| APPLICATION NO. | : 11/545520 | |
| DATED | : December 9, 2008 | |
| INVENTOR(S) | : Jai-yong Han et al. | |

It is certified that error appears in the above-identified patent and that said Letters Patent is hereby corrected as shown below:

Title Page, Page 2, Item (56) References Cited, Other Publications, line 1 change "U.S. Appl. No. 11/545,518, filed Oct. 11, 2006, In-Jae et al." to
-- U.S. Appl. No. 11/545,518, filed Oct. 11, 2006, In-Jae Song et al. --

Signed and Sealed this

Third Day of February, 2009

JOHN DOLL
*Acting Director of the United States Patent and Trademark Office*